United States Patent [19]

Lins

[11] 4,122,538

[45] Oct. 24, 1978

[54] SINGLE WALL DOMAIN, STRIPE DOMAIN MEMORY PLANE

[75] Inventor: Stanley James Lins, Minneapolis, Minn.

[73] Assignee: Sperry Rand Corporation, New York, N.Y.

[21] Appl. No.: 710,773

[22] Filed: Aug. 2, 1976

[51] Int. Cl.² ............................................. G11C 19/08
[52] U.S. Cl. ........................................ 365/29; 365/2; 365/12; 365/30; 365/32; 365/34; 365/36
[58] Field of Search ................... 340/174 TF; 365/29, 365/32

[56] References Cited

U.S. PATENT DOCUMENTS

| 3,706,081 | 12/1972 | Bobeck et al. | 340/174 TF |
|---|---|---|---|
| 3,887,905 | 6/1975 | Bobeck et al. | 340/174 TF |
| 3,916,395 | 10/1975 | Urai | 340/174 TF |
| 3,940,750 | 2/1976 | Voegeli | 340/174 TF |
| 3,944,842 | 3/1976 | Dorleijn et al. | 340/174 TF |
| 3,996,571 | 12/1976 | Chang | 340/174 TF |

Primary Examiner—James W. Moffitt
Attorney, Agent, or Firm—Kenneth T. Grace; William E. Cleaver; Marshall M. Truex

[57] ABSTRACT

A laminated, integral structure that forms a bubble memory plane for the generation, storage and transfer of single wall domains, bubble domains or bubbles is disclosed. The memory plane is formed of a non-magnetic gadolinium gallium garnet (GGG) support member; formed upon the support member is a magnetizable layer that is capable of sustaining stripe domains; formed upon the stripe domain layer is a non-magnetic gadolinium gallium garnet (GGG) spacer layer; and, formed upon the spacer layer is a magnetizable layer in which single wall domains or bubbles are capable of being generated, sustained and transferred from one position to another along a planar dimension of the bubble domain layer.

4 Claims, 5 Drawing Figures

NUCLEATE & TRANSFER OUT BUBBLES   ∅1

TRANSFER IN & READOUT BUBBLES   ∅2

NUCLEATE & ANNIHILATE STRIPES   ∅3

TRANSFER STRIPES   ∅4

SINGLE WALL DOMAIN, STRIPE DOMAIN MEMORY PLANE

BACKGROUND OF THE INVENTION

Since the early reports, see the publication "Properties and Device Applications of Magnetic Domains in Orthoferrites", A. H. Bobeck, The Bell System Technical Journal, October 1967, pages 1901-1925, intensive studies have been conducted on cylindrical domains, single wall domains, bubble domains or more simply bubbles, in magnetizable films with perpendicular anisotropy. The chief intended application is as a solid-state memory element replacement for disc files. The economic criteria for a viable bubble domain memory technology are therefore well defined in the commercial marketplace, the chief criterion being low cost. For military and space applications, additional criteria become evident. The most obvious approach to meeting these criteria is an increased device density by reducing component size of conventional-design bubble devices. The state of the art bubble devices utilize 5 micron ($\mu$m) diameter bubbles and a Permalloy-bar structure—see the publication "Magnetic Bubbles", A. H. Bobeck, et al., Scientific American, September 1970, pages 78-90. This type of device can be useable with bubbles down to a 3 micron diameter when photolithography is used. Further increase of density in this type of structure requires the use of e-beam mask generation and x-ray resist exposure. Submicron-size bubble devices have been fabricated by this means—see the publication "Bubble Device Overlay Fabrication Using Scanned Electron Beams", D. Webb, Microelectronics, Volume 7, No. 1, 1975, pages 22-26. When working with e-beam/x-ray processes it becomes quite apparent that tolerances are difficult to hold, that the implied larger number of bits per chip decreases device yield, and that generally the newer processes are more costly and difficult to use as compared to photolithography, especially for multi-layer devices.

Several concepts have been proposed to allow erasing of constraints on lithographic tolerances—see the publication "Magnetic Bubbles—An Emerging New Memory Technology", A. H. Bobeck, et al., Proceedings of the IEEE, Volume 63, No. 8, August 1975, pages 1176-1195. One concept is the contiguous disc file. This concept utilizes magnetic features that are large compared to bubble diameter, and, as a result, for a given lithographic resolution, a four-fold increase in device density may be achieved. This type of concept has a disadvantage that discrete features are required to define the discrete storage cells. A second concept intended to increase bubble density is the bubble lattice file (BLF)—see the publication "The Use of Bubble Lattices For Information Storage", O. Voegeli, et al., AIP Conference Proceedings, No. 24, pages 617-619, 1975. The BLF eliminates potential-well structuring features and uses wall structures for information storage. The BLF suggests that the elimination of discrete features for each storage cell is a key conceptual design factor for high density bubble devices. The BLF, as presently conceived, still suffers one serious drawback; that is the inability to propagate a long series of bubbles without complex propagate circuitry. This fact leads to a second conceptual design factor for design of high density devices; elimination of complex propagate circuitry. It cannot be expected that all discrete structuring and propagate features must be eliminated. However, it would suffice if the storage areas only could be designed to use simplified structuring and propagate schemes since, as the devices become larger, the storage role predominates over the special functions of write-/address/read.

U.S. Pat. No. 3,940,750 describes a concept wherein information in the form of data bits is stored as polarity reversals in linear domain walls separating adjacent magnetic domains. While offering high storage density, realization of the concept requires use of combinations of mechanisms of unproven reliability. The present invention is directed toward a concept that utilizes a simplified structuring and propagate scheme.

SUMMARY OF THE INVENTION

The present invention is directed toward a bubble memory plane that utilizes stripe domains in a multi-layer garnet medium to structure and propagate bubbles. The concept of the present invention utilizes a garnet structure that utilizes a first stripe domain layer and a second bubble domain layer sandwiching a garnet (GGG) spacer therebetween. The stripe domains in the stripe domain layer form a periodic variation of potential energy well-depth which wells capture the bubbles in the bubble domain layer and space the bubbles uniformly in accordance with the spacing of the stripe domains. The array of stripe domains is then made to move uniformly, propagating the captured bubbles in the bubble domain layer. The bubbles in the bubble domain layer can be guided in the direction of stripe domain motion by means of guidance channels that are associated with the bubble domain layer and that are oriented perpendicular to the length of the stripe domains in the stripe domain layer. Various conformations of the garnet structure may be utilized to perform the functions of generate, transfer, annihilate, replicate and detect. The stripe domains in the stripe domain layer are sustained by the natural characteristics of the stripe domain layer, and, thus, are self-structuring.

DESCRIPTION OF THE PREFERRED EMBODIMENTS

Figure 1:
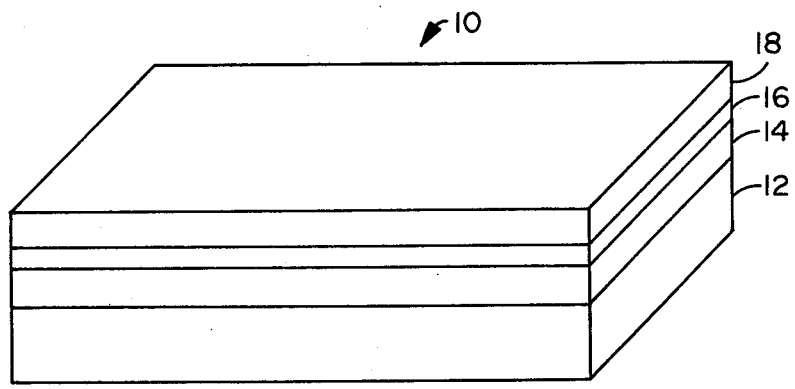
FIG. 1 is a perspective view of a bubble memory plane of the present invention.
Figure 2:
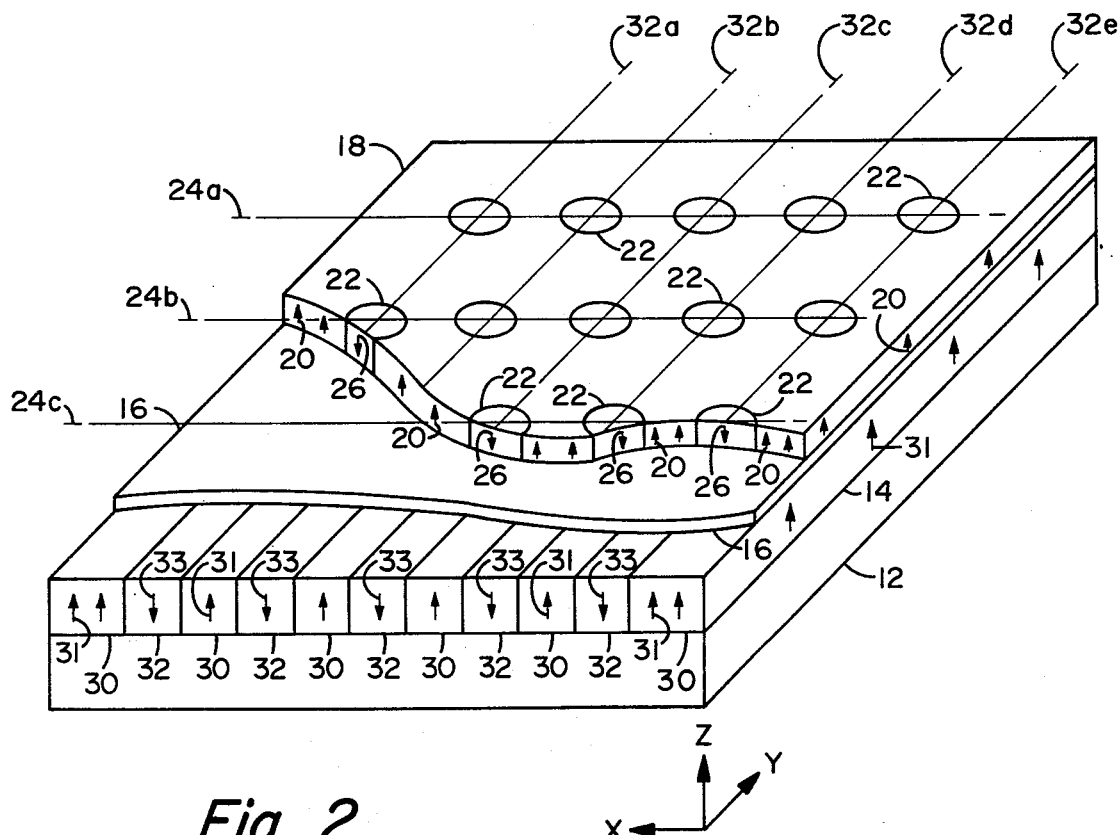
FIG. 2 is a perspective, partially cut away view of the bubble memory plane of FIG. 1.

With particular reference to FIGS. 1 and 2 there are illustrated perspective views of the bubble memory plane 10 of the present invention. The use of multi-layer garnet films, formed by liquid-phase epitaxy (LPE) to form self-biasing bubble devices is well known in the prior art—see the publication "Bubble Domains in Double Garnet Films", Y. S. Lin, et al., JAP, Volume 45, No. 9, September 1974, pages 4084-4094. The present invention adds to this prior art construction a magnetizable layer in which stripe domains are capable of being generated, sustained and moved—see the publication "Variation of Stripe Domain Spacing In A Faraday Effect Light Detector", T. R. Johansen, et al., JAP, Volume 42, No. 4, Mar. 15, 1971, pages 1715, 1716.

Bubble memory plane 10 is formed by the well-known liquid-phase epitaxy method in which there is first generated a garnet support layer 12 of gadolinium gallium garnet (GGG) of approximately 80 microns ($\mu$m) in thickness. Next upon support layer 12 there is generated a stripe domain layer 14 of a magnetizable material of 3-10 $\mu$m in thickness in which stripe domains may be generated, sustained and moved. Next, upon stripe domain layer 14 there is generated a garnet spacer layer 16 of GGG of 0.5-10 $\mu$m in thickness. Lastly, upon garnet spacer layer 16 there is generated a bubble domain layer 18 of a magnetizable material of 5-10 $\mu$m in thickness in which bubble domains may be generated, sustained and moved.

Bubble memory plane 10, so formed, is a laminated, integral structure in which the stripe domains 30, 32 of the stripe domain layer 14 are of alternating, oppositely, normal to the plane thereof, directed magnetization polarizations, and are parallely aligned along the Y axis while the bubble domains 22 in bubble domain layer 18 are parallely aligned along the X axis in channels formed by, e.g., ion implantation in the bubble domain layer 18—see the publication "Ion Implanted Patterns For Magnetic Bubble Propagation", R. Wolfe, et al., AIP Conference Proceedings, No. 10, pages 339-343, 1972—or in rails formed by structured variations in the film thickness of the bubble domain layer 18—see the publication "Effects of Abrupt Changes In Film Thickness On Magnetic Bubble Forces", T. W. Collins, et al., IBM Journal of Research and Development, March 1976, pages 132-137.

With the magnetization M of bubble domain layer 18 oriented by a bias field $H_B$ in a generally upward direction, denoted by vectors 20, the bubble domains 22 that are aligned in the channels 24a, 24b, 24c, and that are formed in bubble domain layer 18 by well-known methods, as suggested above, have their magnetization M oriented in the downward direction, denoted by vectors 26, all as is well known in the art. The stripe domains 30, 32 in stripe domain layer 14 have their magnetization M orientations in alternating upward-downward directions, respectively, denoted by vectors 31, 33 whereby the alternate downwardly directed magnetization M orientations of vectors 33, in vector alignment with the downwardly directed magnetization M orientations of vectors 26 of the bubble domains 22 in bubble domain layer 18, form potential energy walls for the vertically oriented bubble domains 22. Thus, each vertical intersection of a channel 24a, 24b, 24c, in bubble domain layer 18 and a stripe domain 32 in stripe domain layer 14, which has its magnetization M orientation in a downwardly direction, denoted by vector 33, forms a structured orientation of the bubble domains 22 in bubble domain layer 18 at each intersection of sets of parallel axes 24a, 24b, 24c and 32a, 32b, 32c, 32d.

To Establish Initial Conditions

1. Apply in-plane, alternating polarity, field $H \simeq \frac{1}{2} H_K$ ($H_K$ is anisotropy field of stripe domain layer 14) to initialize stripes 30, 32 in stripe domain layer 14.

2. Increase bias field $H_B$, normal to plane of memory plane 10, to exceed collapse field for bubble domain layer 18, but do not exceed field intensity that is necessary to cause stripes 30, 32 in stripe domain layer 14 to contract and/or collapse.

3. Decrease $H_B$ to level sufficient to maintain straight parallel stripes 30, 32. This field $H_B$ intensity is discussed in the publication "Stability of Parallel Stripe Domains", T. W. Collins, IEEE Transactions on Magnetics, Volume MAG-11, No. 5, September 1975. Straight stripes 30, 32 can be maintained over a wider bias field $H_B$ range by having some in-plane anisotropy in the Y direction.

4. The bubbles 22 which carry the information stored in memory plane 10 are generated in a conventional manner. The bubbles 22 are then fed into the guidance channels 24a, 24b, 24c by means of discrete overlay or ion-implanted surface features under the influence of an external gross magnetic field or by means of current-activated circuitry. The bubble domain layer 18 must have magnetic properties suitable to allow support of bubbles 22 for the same bias field $H_B$ as used for supporting stripes 30, 32 in the stripe domain layer 14.

To Propagate Bubble Domains

5. Propagation of the stripe domains 30, 32 is effected by nucleating a new stripe domain at the input edge of the stripe domain layer 14 "corral", forcing successive stripe domains to move away from the input side of the "corral" (containment barriers) toward the output or readout edge of the array "corral". The effect of coercivity is reduced by applying a perpendicular, or under some conditions, a parallel "tickling" field, i.e., an AC field to keep the stripe domain walls in motion—see the E. J. Torok, et al., U.S. Pat. No. 3,752,563. The stripe domain displacement is aided by annihilating a stripe domain at the readout edge of the "corral" or containment area.

6. Bubble domains 22 are transferred out of the guidance channels as in 4 above and are expanded and detected by conventional means.

Figure 3:
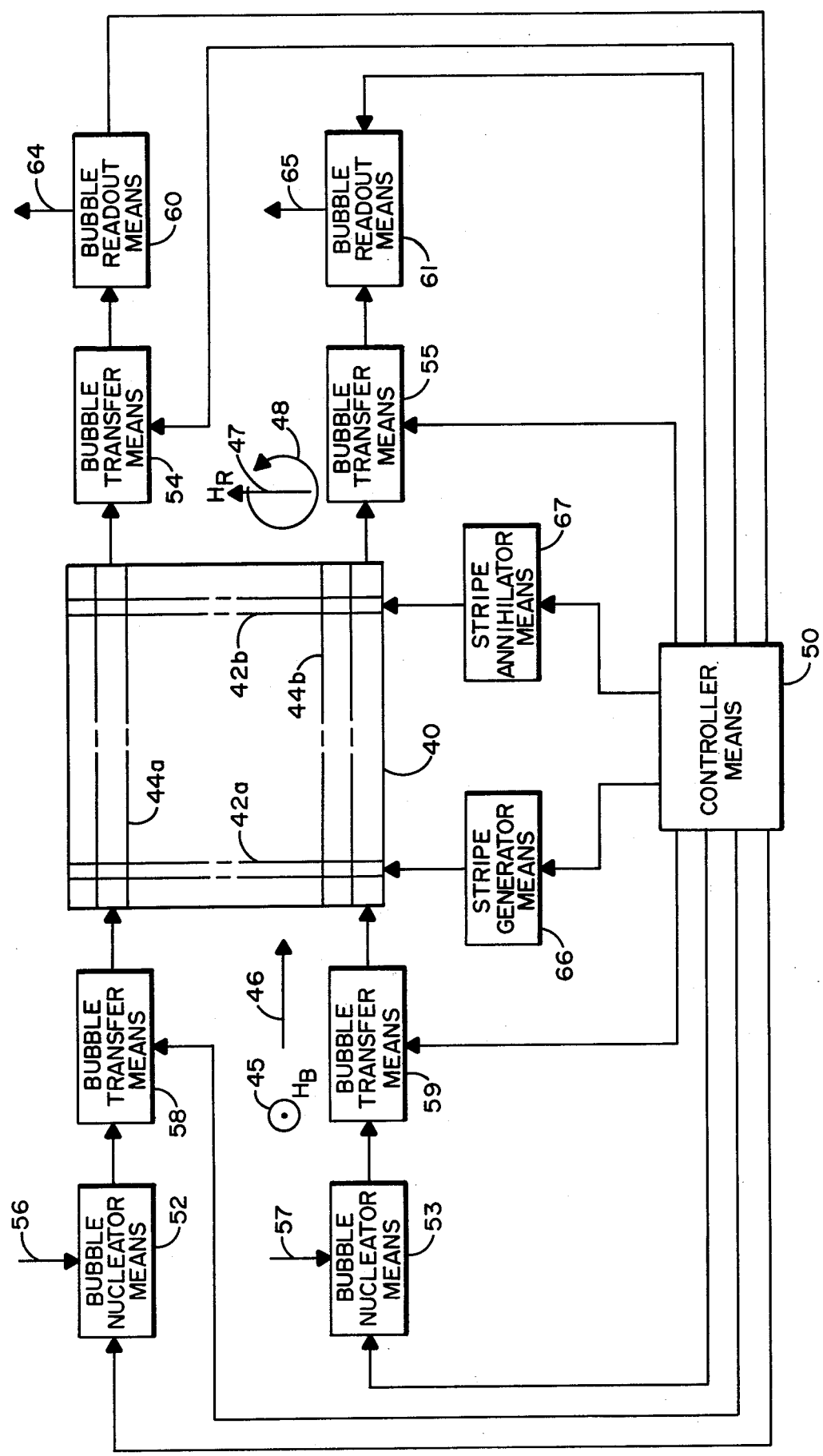
FIG. 3 is a block diagram of a system for implementing a method of operating the bubble memory plane of FIG. 1.

With particular reference to FIG. 3 there is presented a block diagram of a system for implementing a method of operating a bubble memory plane 40, which bubble memory plane is constructed in the manner similar to that discussed with respect to FIGS. 1 and 2, in the manner of the present invention. The bubble memory plane 40 has a plurality of stripe domains 42a, 42b aligned in a vertical direction and a plurality of guidance channels 44a and 44b aligned in a horizontal direction. The configuration of FIG. 3 causes bubbles to be selectively generated at the lefthand edge of the guidance channels 44a, 44b, to be transferred along guidance channel 44a, 44b into the magnetic influence of the stripe domain 42a, whereupon the stripe domain 42a is caused to be rightward directioned, as represented by vector 46, from whence the bubbles are read out in the conventional manner. It is to be appreciated that the conventional bias bield $H_B$ directed upwardly normal to the plane of bubble memory plane as represented by circle 45 and the rotating in-plane field $H_R$ represented by vectors 47 and 48 will be coupled to bubble memory plane—see the L. J. Kochel, et al., patent application Ser. No. 611,105 filed Sept. 8, 1975 now U.S. Pat. No. 3,988,723.

Figure 4:
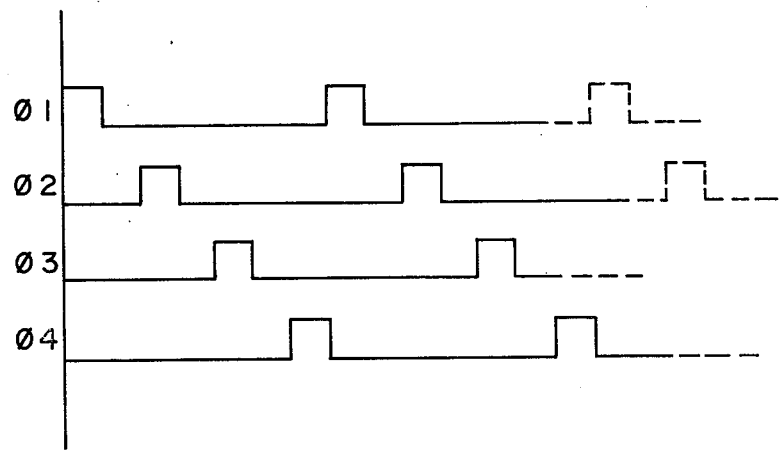
FIG. 4 is a timing diagram utilized by the system of FIG. 3.

Controller means 50 operates upon a basic four-phase clock control sequence as illustrated in FIG. 4. Initially, at clock $\phi_1$ time, controller means 50 couples the appropriate control signals to bubble nucleator means 52 and 53 and to output bubble transfer means 54 and 55. At this time, the appropriate logic signals are coupled to the input means 56 and 57 such that bubble nucleator means 52 and 53 may selectively generate vel non a bubble that is to be written into the associated guidance channel 44a and 44b. Next, at clock $\phi_2$ time, controller means 50 couples the appropriate control signals to input bubble transfer means 58 and 59 causing the bubble generated by the bubble nucleator means 52 and 53 to be written into the lefthand end of the associated guidance channel 44a, 44b. Additionally, at clock $\phi_2$ time, controller means 50 couples the appropriate control signals to bubble readout means 60 and 61 who provide on their output lines 64 and 65 the appropriate output signals representative of the detection vel non of the bubbles transferred into output bubble transfer means 54 and 55 from the righthand end of the associated guidance channels 44a, 44b at the immediately previous clock $\phi_1$ time.

Next, at clock $\phi_3$ time, controller means 50 couples the appropriate control signals to stripe generator means 66 and to stripe annihilator means 67 whereby a new stripe domain 42a is generated along the lefthand edge of bubble memory plane 40 while concurrently the stripe domain 42b along the righthand edge of bubble memory plane 40 is annihilated in preparation of the transfer of the vertically oriented stripe domains in bubble memory plane 40 to be shifted one stripe domain position to the right as denoted by vector 46.

Next, at clock $\phi_4$ time, control means 50 couples the appropriate control signals to stripe generator means 66 whereby the stripe domain generated during the immediately previous clock $\phi_3$ time, and all other stripe domains 42 in bubble memory plane 40 between the positions represented by stripe domains 42a and 42b will be shifted one stripe domain position to the right. At this time, with the shifting of the stripe domains 42 one stripe domain position to the right the bubble domains are caused to move along with their associated stripe domains to maintain their positions in the potential energy wells created by each intersection of a horizontally oriented guidance channel and each vertically oriented stripe domain.

Figure 5:
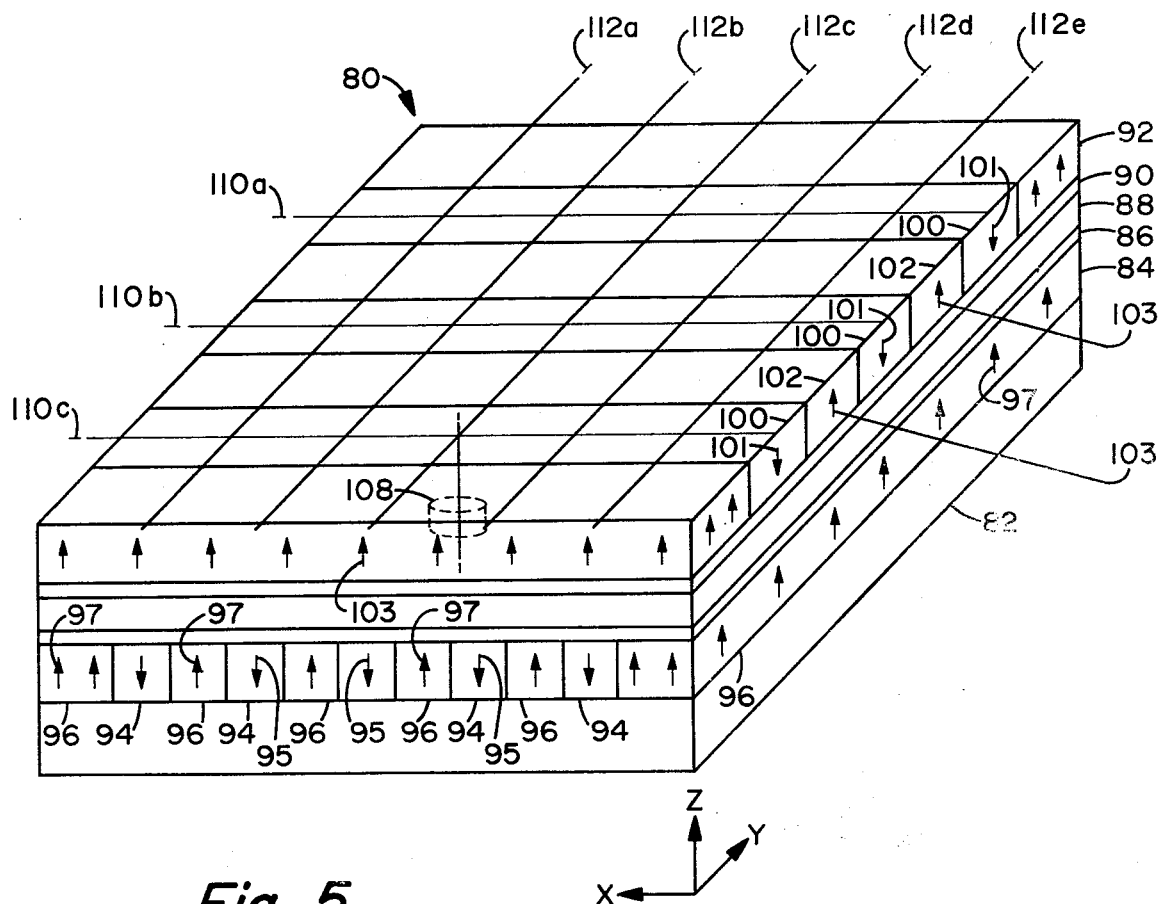
FIG. 5 is a perspective view of a second embodiment of the bubble memory plane of the present invention.

With particular reference to FIG. 5 there is presented a perspective view of a second embodiment of the present invention. Bubble memory plane 80, as is bubble memory plane 10 of FIGS. 1, 2, is formed by the well-known liquid-phase epitaxy method in which there is first generated a garnet support layer 82 of gadolinium gallium garnet (GGG) of approximately 80 microns ($\mu$m) in thickness. Next, upon support layer 82 there is generated the stripe domain layer 84 of a magnetizable material of 3–10 $\mu$m in thickness in which stripe domains may be generated, sustained and moved. Next, upon stripe domain layer 84 there is generated a garnet spacer layer 86 of GGG of 0.5–10 $\mu$m in thickness. Next, upon garnet spacer layer 86 there is generated a bubble domain layer 88 of a magnetizable material of 5–10 $\mu$m in thickness in which bubble domains may be generated, sustained and moved.

This construction of bubble memory plane 80 is similar to that of the above described bubble memory plane 10 of FIGS. 1 and 2. However, bubble memory plane 80 of FIG. 5 includes two additional essential layers. Upon bubble domain layer 88 there is generated a garnet spacer layer 90 of GGG of 0.5–10 $\mu$m in thickness. And, lastly, upon garnet spacer layer 90 there is generated a stripe domain layer 92 of a magnetizable material of 3–10 $\mu$m in thickness in which stripe domains may be generated, sustained and moved. In this configuration, stripe domain layer 84 has an in-plane anisotropy in the Y direction while stripe domain layer 92 has an in-plane anisotropy in the orthogonal X direction. Thus, stripe domain layer 84 will sustain stripe domains 94, 96 having a length or longitudinal axis aligned in the Y direction while stripe domain layer 92 will sustain stripe domains 100, 102 having a length or longitudinal axis aligned in the X direction.

In this configuration, the energy wells at the intersections of the X directioned axes 110a, 110b, 110c, that are associated with the stripe domains 100 in stripe domain layer 92 and of the Y directioned axes 112a, 112b, 112c, 112d, 112e that are associated with the stripe domains 94 of stripe domain layer 84 are at a minimum causing bubbles to be captured thereby. This is as illustrated by bubble 108 which is captured by the vertically aligned, downwardly directed vectors 101 and 95 of X axis 110c and Y axis 112c. To propagate or transfer the bubbles in bubble domain layer 88, one of the stripe domain layers, e.g., stripe domain layer 92 is selected to function as the guidance-channel-forming-stripe-domains while the other stripe domain layer, e.g., stripe domain layer 84, is selected to function as the transfer or propagate means as discusssed with respect to bubble memory plane 10 of FIGS. 1, 2. Note that the stripe domains 100, 102 of stripe domain layer 92 perform the same function as and replace the guidance channels formed in bubble domain layer 18 of bubble memory plane 10 of FIGS. 1 and 2.

It is understood that amorphous or polycrystalline magnetic and nonmagnetic materials can be used in place of garnet films. For example, the stripe domain films can be made of a nickel-iron alloy or of amorphous alloys of gadolinium-cobolt-diluent. The bubble layer can be made of amorphous alloys of gadolinium-cobolt-diluent. Spacer layers can be polycrystalline films such as silicon dioxide when amorphous or polycrystalline magnetic films are used.

What is claimed is:

1. A bubble domain memory plane comprising:
   a first stripe domain layer having a plurality of stripe domains formed therein;
   a bubble domain layer having a plurality of bubble domains formed therein;
   a second stripe domain layer having a plurality of stripe domains formed therein, the stripe domains associated with said second stripe domain layer aligned substantially perpendicular with the stripe domains associated with said first stripe domain layer for forming a plurality of stripe domain intersections therebetween; and,
   the magnetization M orientations in said first and second stripe domain layers, in alternate ones of said stripe domain intersections, vectorially aligned with the magnetization M orientations in consecutive ones of said bubble domains for forming a structural orientation of said bubble domains in only alternate ones of said stripe domain intersections and between the associated stripe domain walls in said first and second stripe domain layers.

2. The memory plane of claim 1 further including means moving the stripe domains in one of said first or second stripe domain layers in a direction that is substantially parallel to the stripe domains in the other one of said first or second stripe domain layers for transferring the bubbles, which are captured at only the alternate ones of said stripe-domain intersections, along their associated stripe domain and between the associated stripe domain walls in said first and second stripe domain layers.

3. A bubble domain memory plane comprising a laminated, integral structure formed as:
   a non-magnetizable support layer;
   a first stripe domain layer, formed upon said support layer, having a plurality of stripe domains formed therein;
   a first non-magnetizable spacer layer, formed upon said first stripe domain layer;
   a bubble domain layer, formed upon said first spacer layer, having a plurality of bubble domains formed therein;
   a second non-magnetizable spacer layer, formed upon said bubble domain layer;
   a second stripe domain layer, formed upon said second spacer layer, having a plurality of stripe domains formed therein, the stripe domains associated with said second stripe domain layer aligned substantially perpendicular to the stripe domains associated with said first stripe domain layer for forming a plurality of stripe domain intersections; and,
   the magnetization M orientations in said first and second stripe domain layers, in alternate ones of said stripe domain intersections, vectorially aligned with the magnetization M orientations in consecutive ones of said bubble domains for forming a structural orientation of said bubble domains in only alternate ones of said stripe domain intersections and between the associated stripe domain walls in said first and second stripe domain layers.

4. The memory plane of claim 3 further including means moving the stripe domains in one of said first or second stripe domain layers in a direction that is substantially parallel to the stripe domains in the other one of said first or second stripe domain layers for transferring the bubbles, which are captured at only the alternate ones of said stripe domain intersections, along their associated stripe domain and between the associated stripe domain walls in said first and second stripe domain layers.

* * * * *